United States Patent
Poplevine et al.

(10) Patent No.: US 7,239,558 B1
(45) Date of Patent: Jul. 3, 2007

(54) METHOD OF HOT ELECTRON INJECTION PROGRAMMING OF A NON-VOLATILE MEMORY (NVM) CELL ARRAY IN A SINGLE CYCLE

(75) Inventors: Pavel Poplevine, Foster City, CA (US); Annie-Li-Keow Lum, Milpitas, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 130 days.

(21) Appl. No.: 11/235,834

(22) Filed: Sep. 26, 2005

(51) Int. Cl.
*G11C 11/34* (2006.01)

(52) U.S. Cl. .................. 365/188; 365/185.14; 365/187; 365/154; 365/156

(58) Field of Classification Search ................ 365/154, 365/156, 188, 187
See application file for complete search history.

(56) References Cited

U.S. PATENT DOCUMENTS

| | | | | |
|---|---|---|---|---|
| 5,646,885 | A | * 7/1997 | Matsuo et al. | 365/185.05 |
| 6,137,723 | A | 10/2000 | Bergemont et al. | 365/185.18 |
| 6,985,386 | B1 * | 1/2006 | Mirgorodski et al. | 365/185.05 |
| 6,992,927 | B1 * | 1/2006 | Poplevine et al. | 365/185.05 |
| 7,020,027 | B1 * | 3/2006 | Poplevine et al. | 365/185.28 |
| 7,042,763 | B1 * | 5/2006 | Mirgorodski et al. | 365/185.05 |
| 7,164,606 | B1 * | 1/2007 | Poplevine et al. | 365/185.28 |
| 7,167,392 | B1 * | 1/2007 | Poplevine et al. | 365/185.08 |

* cited by examiner

*Primary Examiner*—Amir Zarabian
*Assistant Examiner*—Jason Lappas
(74) *Attorney, Agent, or Firm*—Stallman & Pollock LLP

(57) ABSTRACT

A non-volatile memory (NVM) cell splits its basic functions, i.e. program, erase, read and control, among a four PMOS transistor structure, allowing independent optimization of each cell function. The cell structure also includes an embedded static random access memory (SRAM) cell that utilizes a latch structure to preprogram data to be written to the cell and a plurality of cascoded NMOS pass gates. The cell structure reduces total programming time and provides the flexibility of programming the entire cell array simultaneously or one row or sector of the array at a time.

14 Claims, 5 Drawing Sheets

METHOD OF HOT ELECTRON INJECTION PROGRAMMING OF A NON-VOLATILE MEMORY (NVM) CELL ARRAY IN A SINGLE CYCLE

TECHNICAL FIELD

The present invention relates to integrated circuit memory devices and, in particular, to a 4-transistor non-volatile memory (NVM) cell that includes a static random access memory (SRAM) cell. The new cell utilizes a hot electron injection programming technique, which, in combination with the SRAM cell and a sequence of cascoded NMOS pass gates, allows an entire NVM cell array, or a selected row or sector of the array, to be programmed at one cycle.

DESCRIPTION OF THE INVENTION

Figure 1:
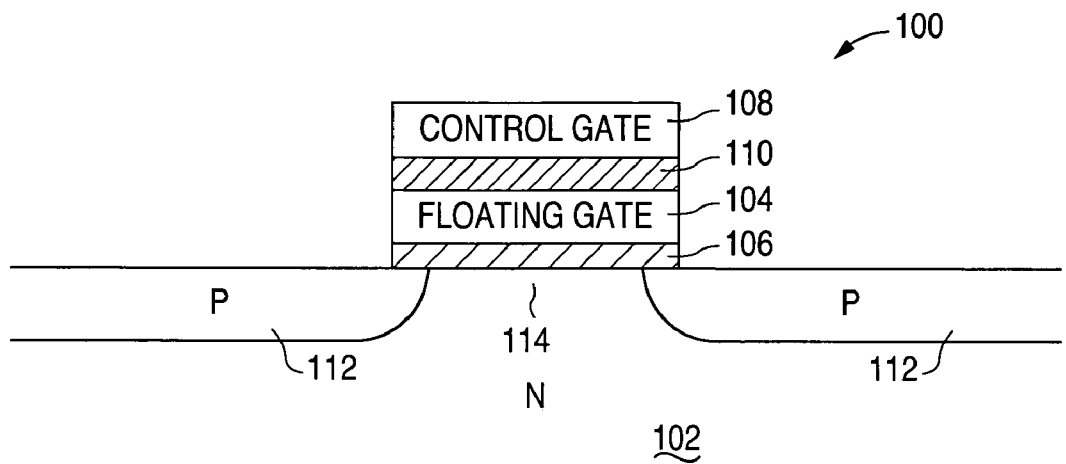
FIG. 1 is a partial cross section drawing illustrating a conventional P-channel insulated gate field effect transistor (P-IGFET) stacked gate non-volatile memory (NVM) cell.

FIG. 1 shows a conventional P-channel insulated gate field effect transistor (P-IGFET), e.g., a P-channel metal oxide semiconductor field effect transistor (P-MOSFET), stacked gate NVM cell 100 formed in an N-type region 102 of semiconductor material (e.g., a crystalline silicon substrate). As is well known, the N-type region 102 is typically an N-well formed in a P-type silicon substrate. The NVM cell 100 typically includes a polysilicon floating gate 104 that is separated from the N-type region 102 by a layer of thin "gate" silicon dioxide 106. A polysilicon control gate 108 is separated from the floating gate 104 by a layer of dielectric material 110, typically a sandwich of oxide-nitride-oxide (ONO). Two P-type diffusion regions 112 are formed in the N-type region 102 at the sides of the stacked gate structure to provide the source and drain regions of the NVM cell 100, defining an N-type channel region 114 between them. Integrated circuit fabrication techniques for making the NVM cell 100 are well known in the industry.

As is also well known, the NVM cell 100 uses hot electron injection in a conventional programming method. When applied to a stacked gate NVM cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative, but lower in absolute value as compared with the drain potential. Under these bias conditions, a high lateral electrical field is generated, thereby creating hot electronics that are affected by a high perpendicular electrical field such that the hot electrons tunnel through the thin gate oxide 106 to reach the floating gate 104. The amount of injection current depends primarily upon the potentials of the drain region and floating gate electrode 104 such that, with more drain voltage, more injection takes place. Further discussion of the NVM cell 100 and its programming technique will be found in U.S. Pat. No. 6,137,723, issued Oct. 24, 2000, which is incorporated herein by reference in its entirety to provide background information regarding the present invention.

Figure 2:
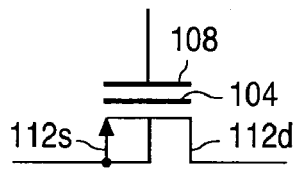
FIG. 2 is a schematic diagram for the FIG. 1 NVM cell.

FIG. 2 shows the NVM memory cell 100 of FIG. 1 in electrical schematic form, including a body-connected N-type source 112s and an N-type drain 112d.

Figure 3:
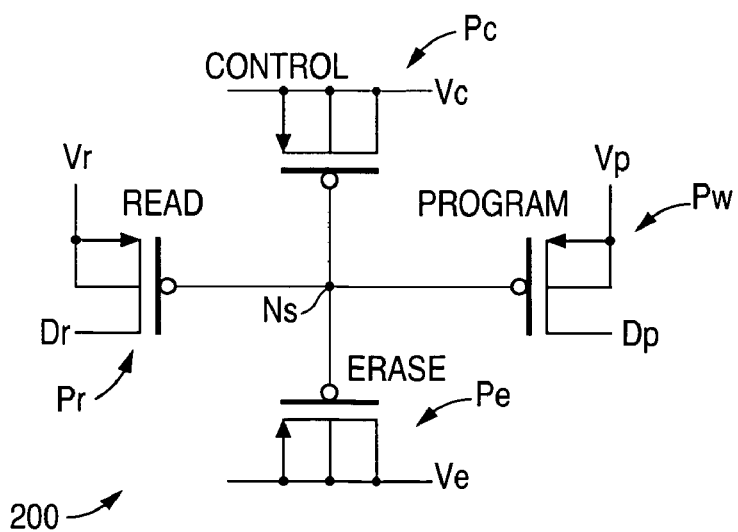
FIG. 3 is a schematic diagram illustrating a 4-transistor PMOS NVM cell.

Co-pending and commonly-assigned U.S. patent application Ser. No. 10/895,710, titled "Improved Nonvolatile Memory Cell", filed by Poplevine et al. on Jul. 8, 2004, discloses an NVM memory cell 200, shown in FIG. 3, that includes four P-IGFETs connected to a common floating gate storage node Ns, with one P-IGFET transistor for each of the four cell functions: program (or write), read, erase and control. Application Ser. No. 10/895,710 is hereby incorporated by reference in its entirety to provide background information regarding the present invention.

The NVM cell 200, while being somewhat large in size or circuit area than the conventional stacked gate cell 100 described above, allows for independent and improved optimization of each cell function.

The program function of the 4-transistor NVM cell 200 is controlled by a first program transistor Pw with interconnected source and bulk regions to which a programming voltage Vp is applied. A programming signal Dp is applied to the drain of transistor Pw. The gate electrode of transistor Pw is connected to the common storage node Ns.

The read function of the NVM cell 200 is controlled by a second read transistor Pr having interconnected source and bulk regions to which a read voltage Vr is applied, a drain region from which a read signal Dr is received, and a gate electrode connected to the common storage node Ns.

The erase function of the NVM cell 200 is controlled by a third erase transistor Pe having interconnected drain, source and bulk regions to which an erase voltage Ve is applied, and a gate electrode connected to the common storage node Ns.

The control function of the NVM cell 200 is controlled by a fourth control transistor Pc having interconnected drain, source and bulk regions to which a control voltage Ve is applied, and a gate electrode connected to the common storage node Ns.

The NVM cell 200 can be programmed in any of a number of ways including conventional techniques as follows. During programming, or writing, the programming voltage Vp (e.g., approximately 5 volts) is applied, with all other electrodes being connected to the circuit reference potential (e.g., ground). During erasing, the erase voltage Ve is applied (e.g., approximately 10 volts), with all other electrodes connected to the circuit reference potential. During reading, the read voltage Vr is applied (e.g., approximately 1 volt), and all other electrodes are connected to the circuit reference potential. (Such voltages are typical for oxide thicknesses in the range of 60-80 Angstroms.)

Co-pending and commonly assigned U.S. patent application Ser. No. 11/182,115, filed on Jul. 15, 2005, by Poplevine et al., titled "Reverse Fowler-Nordheim Tunneling Programming for Non-Volatile Memory Cell", discloses a programming mode for the above-described 4-transistor NVM cell 200 that utilizes reverse Fowler-Nordheim tunneling. When the potential difference between the floating gate and drain and source and body exceeds the tunneling threshold voltage ($V_{FN}$), electrons tunnel from the drain and source to the gate. This makes the floating gate negatively charged. Application Ser. No. 11/182,115 is hereby incorporated by reference in its entirety to provide background information regarding the present invention.

Figure 4:
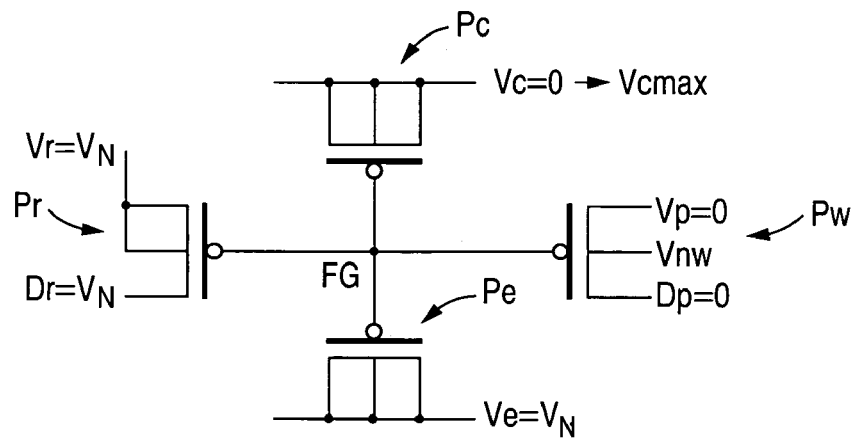
FIG. 4 is a schematic diagram illustrating the bias conditions for programming the FIG. 3 NVM cell.

The programming conditions for the NVM cell 200, as disclosed in application Ser. No. 11/182,115, are shown in FIG. 4. The read voltage Vr applied to the bulk-connected source region of the read transistor Pr, the read signal Dr applied to the drain region of the read transistor Pr, and the erase voltage Ve applied to the interconnected drain, source and bulk regions of erase transistor Pe are all connected to receive an inhibit voltage $V_N$. Inhibit voltage $V_N$ should be at a level high enough to prevent reverse Fowler-Nordheim tunneling, but low enough to ensure no forward tunneling. Voltage $V_N$ depends upon gate oxide thickness: for example, $V_N \sim 3.3V$ for a gate oxide thickness of 70 Å. Setting the read voltage Vr, the read signal Dr and the erase voltage Ve to inhibit voltage $V_N$ is done to prevent the read transistor Pr and the erase transistor Pe from being programmed. The programming voltage Vp and the programming signal Dp of the program transistor Pw are both tied to 0V. The voltage Vnw on the bulk of the programming transistor Pw can be tied to either 0V or to Vdd. The control gate voltage Vc on the control transistor Vc is then swept from 0V to a maximum voltage Vcmax in a preselected programming time Tprog. Time Tprog is in the range of tens of milliseconds. The programming time Tprog affects the amount of negative charge that will tunnel to the common node, i.e. floating gate node FG in FIG. 4.

The maximum control gate voltage Vcmax must exceed the tunneling threshold voltage $V_{FN}$; it affects the amount of negative charge to put on the floating gate FG. Voltage applied to control gate Vc of control transistor Pc is coupled through control transistor Pc to the floating gate node FG. When voltage at the floating gate FG reaches the tunneling threshold $V_{FN}$, then electrons tunnel from the drain/source/body of the program transistor Pw to the floating gate FG, making the floating gate FG more negative. The tunneling process continues as the control gate Vc is swept. At the end of the program cycle, the floating gate FG will be left with a net negative charge from the reverse Fowler-Nordheim tunneling programming regime.

There is no current consumption in the read transistor Pr, or the erase transistor Pe, or the control transistor Pc during the programming process. The only current is the Fowler-Nordheim tunneling current, which is about 10 pA per transistor. Those skilled in the art will appreciate that this allows the use of a smaller charge pump.

NVM cells in the array that are not selected for programming should be inhibited from being programmed by applying the inhibiting voltage $V_N$ to all electrodes (Vr, Dr, Ve, Dp, Vp and Vnw) of the unselected cells.

For an NVM cell array of the type disclosed in the above-cited application Ser. No. 11/182,115, to program the array, it is necessary to cycle through all the rows and columns of the array, causing the programming time of the array to be long. Co-pending and commonly assigned U.S. patent application Ser. No. 11/183,198, filed on Jul. 15, 2005, by Poplevine et al., titled "A Non-Volatile Memory Cell With Improved Programming Technique", discloses the FIG. 4 4-transistor NVM cell embedded with a conventional 6-transistor static random access memory (SRAM) cell, thereby enabling the total programming time for the NVM array to be reduced. Application Ser. No. 11/183,198 is hereby incorporated be reference to provide additional background information regarding the present invention.

Figure 5:
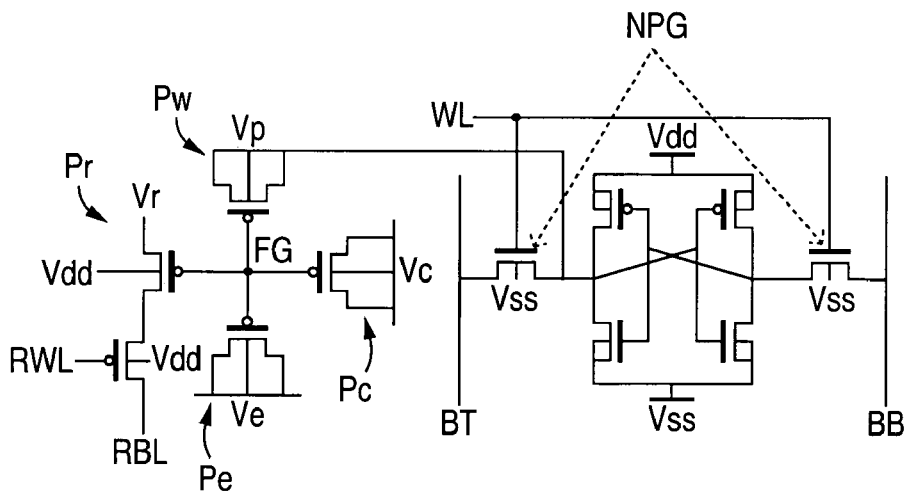
FIG. 5 is a schematic diagram illustrating a 4-transistor PMOS NVM cell with an embedded 6-transistor static random access memory (SRAM) cell.

FIG. 5 shows the 4-transistor NVM cell with embedded 6-transistor SRAM cell as disclosed in application Ser. No. 11/183,198. The SRAM cell includes two NMOS pass gates (NPG) and a conventional 4-transistor cross-coupled latch (two PMOS devices and two NMOS devices) to maintain written data. To access the SRAM cell, word line WL is at the VDD power level to open the two pass gates NPG. To write a "0" into the latch, bit line BT is at zero and bit line BB is at the VDD power level. To write a "1" into the latch, bit line BB is at zero and bit line BT is at the VDD power level. To read from the SRAM cell, both bit line BT and bit line BB are precharged to VDD. A zero is read if bit line BT is discharged to ground; a one is read if bit line BB is discharged to ground.

Prior to the programming cycle, data are written to the SRAM cells in the entire array; after that, the programming cycle can be started. To program the array, the reverse Fowler-Nordheim programming sequence disclosed in above-cited application Ser. No. 11/182,115 is used.

Figure 6:
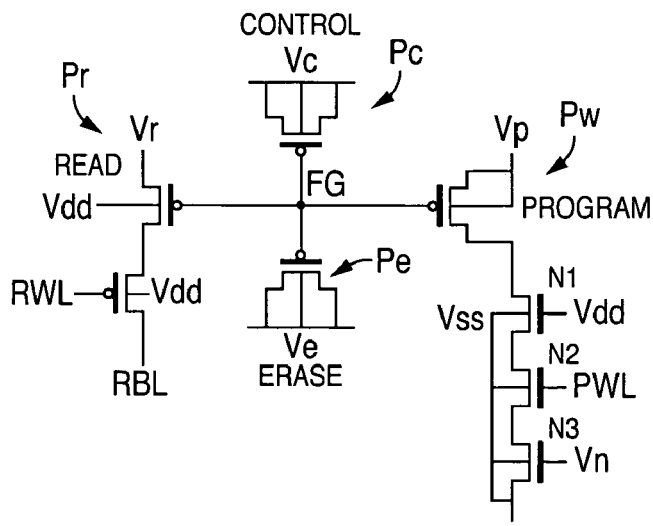
FIG. 6 is a schematic diagram illustrating a 4-transistor PMOS NVM cell with N pass gates for a program operation and a P pass gate for a read operation.

The present invention utilizes the hot electron injection mechanism to program an NVM cell. The 4-transistor PMOS NVM cell that uses this mechanism is shown in FIG. 6. As shown in FIG. 6, the NVM cell shown therein includes a plurality of cascoded NMOS pass gates (N1, N2 and N3) connected to the program transistor Pw and a PMOS pass gate connected to the read transistor Pr.

Figure 7:
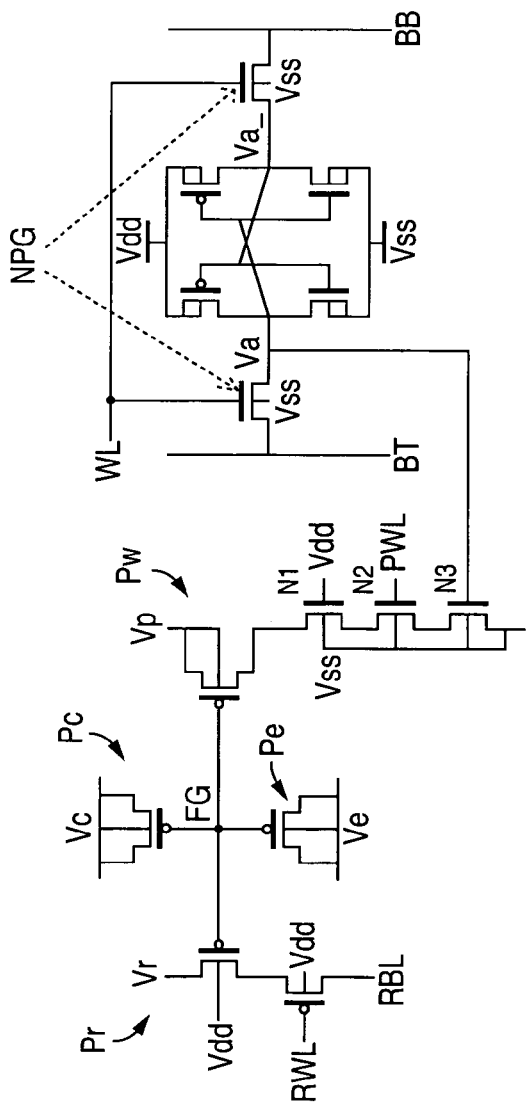
FIG. 7 is a schematic diagram illustrating the FIG. 6 4-transistor PMOS NVM cell with an embedded 6-transistor SRAM cell and a plurality of NMOS pass gates in accordance with the concepts of the present invention.

However, in order to mass program an NVM cell array, a new type of NVM cell is disclosed. The new cell, shown in FIG. 7, includes the FIG. 6 4-transistor PMOS NVM cell with the three cascoded N channel pass gates and the PMOS pass gate and a 6-transistor SRAM cell that operates as a standard SRAM of the type described above in conjunction with application Ser. No. 11/183,198. As shown in FIG. 7, the SRAM cell is connected to the gate of NMOS pass gate transistor N3.

Prior to the program cycle, data are prewritten to the SRAM cells in the whole array. As shown in FIG. 7, the SRAM cell has two NMOS pass gate (NPG) and a 4-transistor cross-couple latch to store written date. To access the SRAM cell, the word line WL should be at the VDD power level (or logic high) to open the two pass gates NPG. To write a zero into the latch, bit line BT should be at zero and bit line BB should be at the VDD power level (or logic high). To write a one, bit line BB should be at zero and bit line BT at the VDD power level (or logic high). To read from the SRAM, both bit line BT and bit line BB are pre-charged to the VDD power level. A zero is read if bit line BT is discharged to ground; a one is read if bit line BB is discharged to ground.

After the SRAM cells of the array have been pre-written, the program cycle for the NVM cell can be initiated. As discussed above, the hot electron mechanism consumes current that depends upon the VDD power level and the floating gate voltage FG. This is ideal for applications in a small array in the range of 4 to 512 bits.

In program mode, the read voltage Vr and the erase voltage Ve are connected to the inhibit voltage $V_N$ to prevent the read transistor Pr and the erase transistor Pe from being programmed. The inhibit voltage $V_N$ should be at a level high enough to prevent reverse Fowler-Nordheim tunneling, but low enough to ensure no forward tunneling.

The program transistor Pw is cascaded with three N channel pass gates (N1, N2 and N3). Pass gate transistor N1 is used to avoid a high voltage between the gate and the drain/source regions. Pass gate transistor N2 is used to enable or disable a program operation; the PWL enable/disable signal applied to the gate of pass gate transistor N2 can be a global enable signal or an output from a row decoder to select a row or a sector. As shown in FIG. 7, the gate potential for pass gate transistor N3 is provided by the associated SRAM cell.

To program a cell, a data "one" (VDD) must be written into the Va node of the SRAM cell. This will make the gate potential of pass gate transistor N3 at VDD during the program cycle. To shield the 4-transistor PMOS NVM cell from being programmed, a data "zero" (ground) is written to the Va node instead. The control gate voltage Vc of control transistor Pc is globally connected. The control gate voltage Vc is then swept from 0v to Vcmax (~10v) in a programming time Tprog in a manner similar to that described above in conjunction with application Ser. No. 11/182,115 and application Ser. No. 183,198. Programming time Tprog is in the range of milliseconds. The programming time Tprog affects the amount of negative charge that will tunnel to the floating gate node FG.

With continuing reference to FIG. 7, when a high voltage, e.g. 5v, is applied as the programming voltage Vp and the bias signal PWL applied to the gate of pass gate transistor N2 is at the VDD level (e.g. 3.3V), the high lateral electric field between node Vp and the drain Dp of program transistor Pw creates hot electrons. The voltage applied to node Vc of control transistor Pc is coupled through control transistor Pc to the floating gate node FG. The gate provides the high perpendicular electric field that attracts electrons to reach the floating gate node FG.

At the end of the program cycle, the control voltage at node Vc is ramped down from maximum voltage Vcmax to 0V, leaving the floating gate node FG with a net negative charge from the hot electron program cycle.

Figure 8:
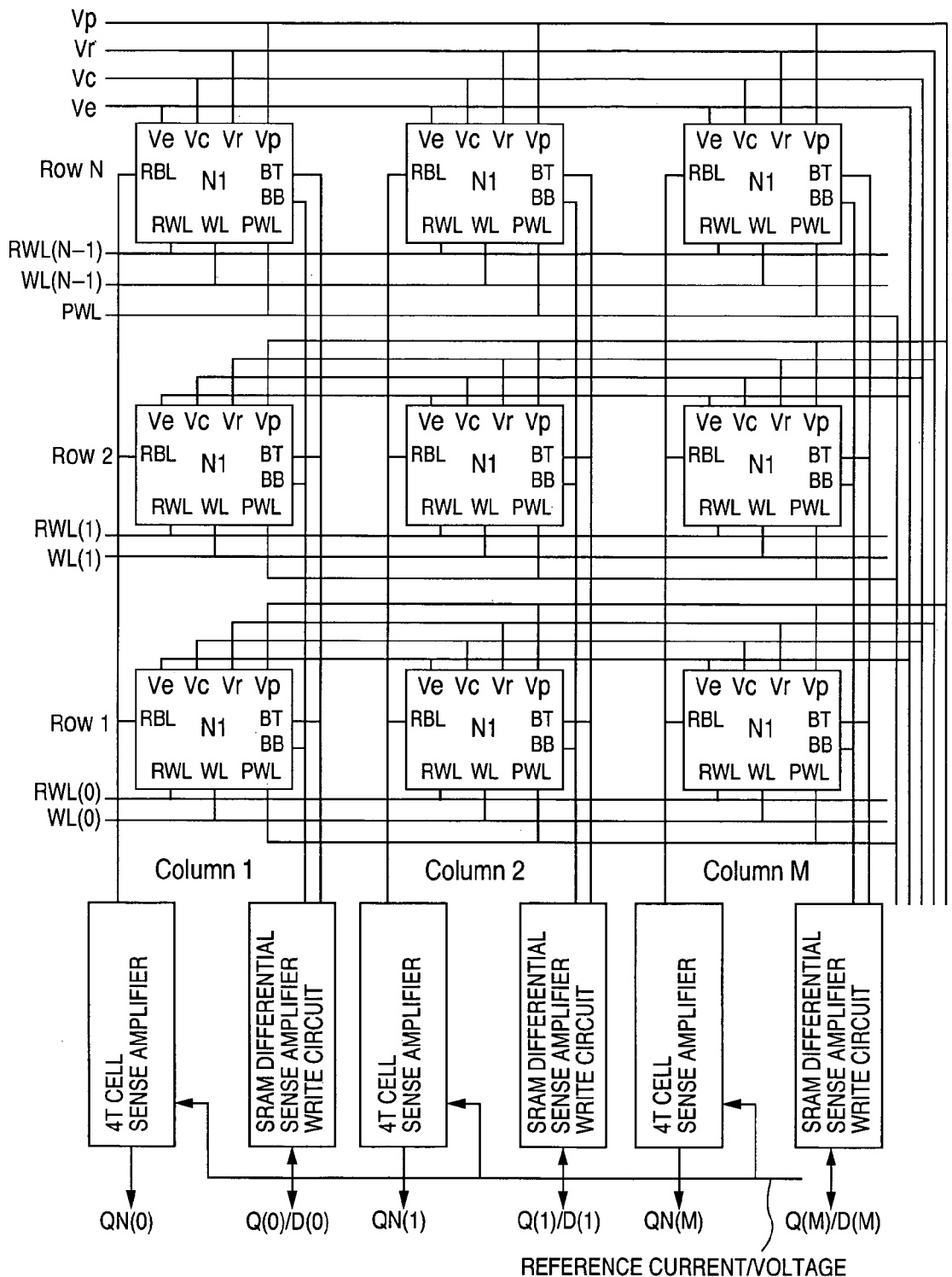
FIG. 8 is a schematic diagram illustrating a cell array comprising a plurality of FIG. 7 NVM cells in accordance with the present invention.

FIG. 8 shows the implementation of a NVM cell array using the NVM cell architecture shown in FIG. 7. The array has N rows and M columns. The word line (WL) selects a needed row to be written or to be read from the SRAM cell. The read word line (RWL) selects a needed row to be read from the 4-transistor NVM cell. The erase voltage Ve, the control voltage Vc and the read voltage Vr are applied to all cells directly without any high voltage switches or other supporting circuitry, thereby significantly simplifying the connection from external or internal power sources.

The erase mode for the FIG. 8 array is similar to that for the single cell as described in application Ser. No. 11/182, 115. The read word lines RWL(0) . . . RWL(N−1) are logic high, the erase voltage Ve is applied (~10V), and the remainder of the signals are grounded. The erase operation will affect all cells. The erase voltage Ve varies from technology to technology.

As discussed above, the program mode has two steps: SRAM write mode and 4T NVM cell program mode.

In the SRAM write mode, data should be ready at D(0) . . . D(M). RWL(0). RWL(N−1) are logic high. One of the word lines (WL), e.g. word line WL(0) should be logic high. The rest of the word lines, WL(1) . . . WL(N−1) should be logic low. To write a zero (program) to the SRAM cell, the corresponding write bit line, e.g. bit line BT(0) should be logic low and bit line BB(0) at logic high. To write a one (remain erased) to the SRAM cell, the corresponding write bit line, e.g. bit line BB(0) should be logic low and bit line BT(0) at logic high. The number of write cycles depends upon the number of rows (N) and the number of columns (M).

In the 4T cell program mode, read word lines RWL(0) . . . RWL(N−1) are logic high. Word lines WL(0) . . . WL(N−1) are logic low. Voltages Ve and Vr are at the inhibit voltage $V_N$. The written SRAM cell provides the logic to program the 4T cell. Vp=5v is applied program word line PWL is logic high. Then, control voltage Vc is swept from 0v to Vcmax. Only one cycle is needed to program the entire array or sector.

The read mode has a 4T NVM read mode or a SRAM read mode.

In the 4T NVM read mode. one of the read word lines (RWL), e.g. RWL(O) should be at logic low. The rest of the read word lines (RWL), RWL(1) . . . RWL(N−1) should be logic high. On all read bit lines RBL(0). RBL(M−1), a high current or voltage is seen if the cell was programmed; a low current or voltage will be seen if the cell was erased. The read voltage Vr is applied to all the cells. The rest of signals are grounded. The RBL(0) . . . RBL(M−1) will be sensed using a 4T cell sense amplifier by comparing the current/voltage with a global reference current/voltage. The reference current/voltage is usually provided by a single or a group of the 4T cell replica. The sensed data are latched to QN(0) . . . QN(M).

In the SRAM read mode, RWL(0) . . . RWL(N−1) are logic high. One of the word lines (WL), e.g. WL(0), should be logic high. The rest of the word lines (WL), WL(1) . . . WL(N−1) should be logic low. If the cell was programmed "zero", then bit line BT will be discharged to ground. If the cell was programmed "one", then bit line BB will be discharged to ground. These bit lines are sensed using SRAM differential sense amplifiers and latched to the output Q(0) . . . Q(M).

Figure 9:
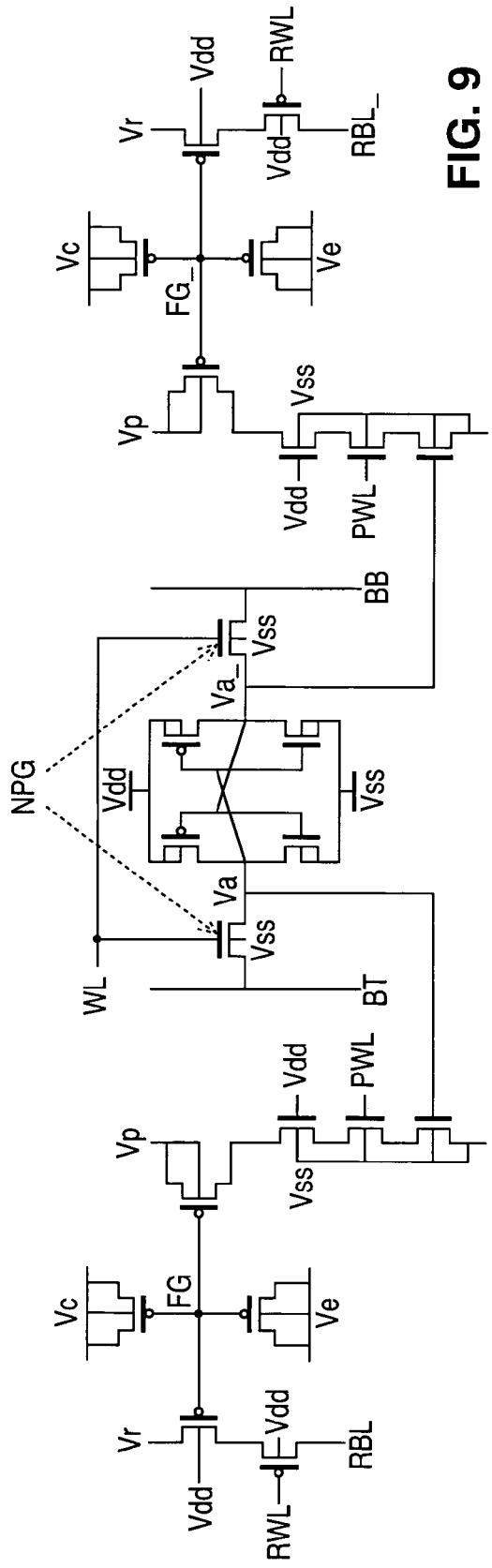
FIG. 9 is a schematic diagram illustrating dual 4-transistor cells of the type shown in FIG. 6 with an embedded 6-transistor SRAM cell in accordance with the present invention.

However, sensing of the 4T NVM cell shown in FIG. 7 using a reference cell is greatly susceptible to process and signal integrity variation. Some technologies may have a larger process variation across the wafer than the other. Some cells may suffer charge loss or may attain charge more than the other. A single reference current may not be a good global reference point for all cells for such technology. For such technologies, a dual 4T NVM cell architecture with SRAM cell, as shown in FIG. 9, is proposed. The additional 4T NVM cell serves like a reference. Since they are close to each other, they tend to behave in a similar way. The operation is the same as the single 4T cell shown in FIG. 7. During the NVM read mode, RBL_acts as a reference to RBL.

Figure 10:
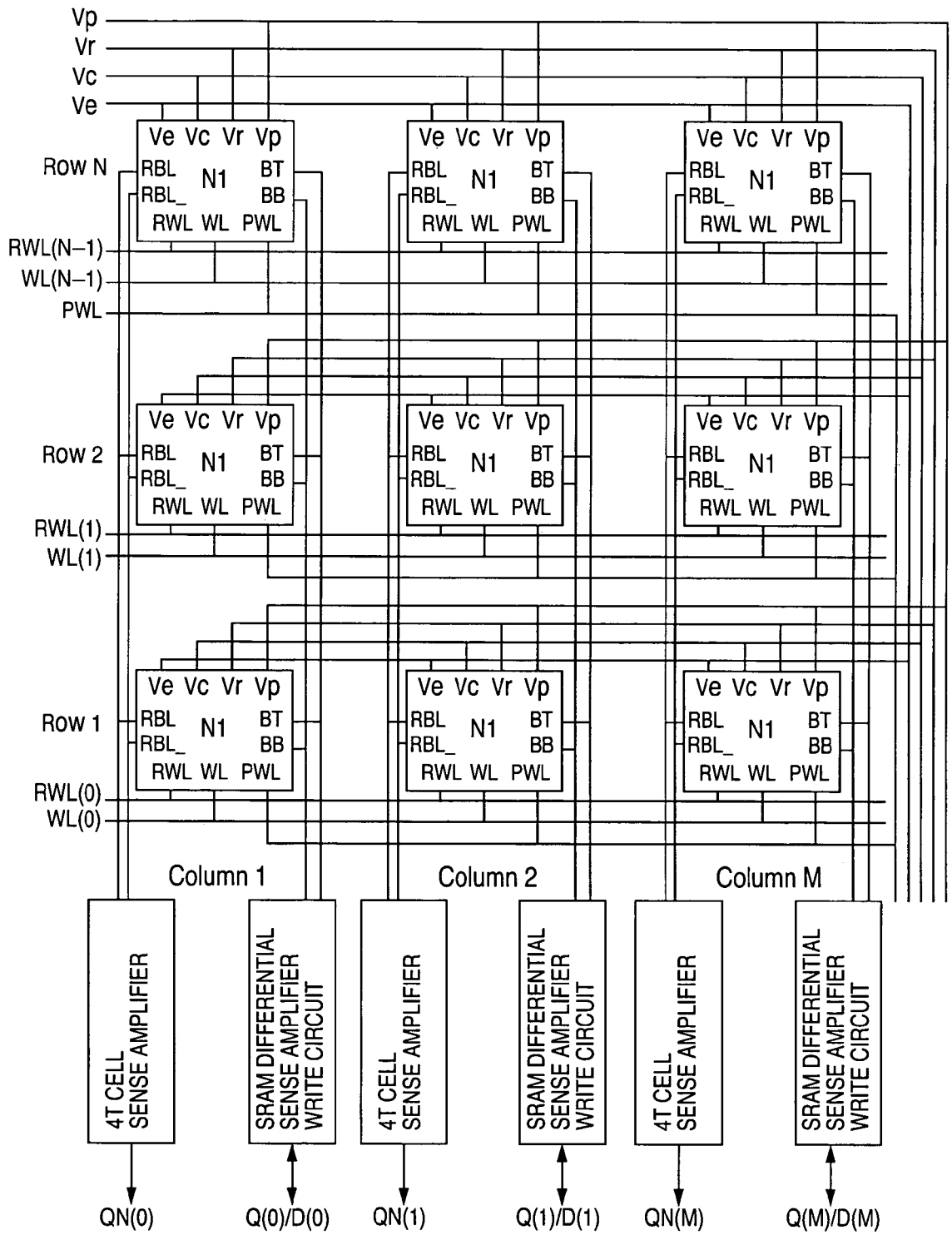
FIG. 10 is a schematic diagram illustrating a cell array comprising a plurality of FIG. 9 NVM cells in accordance with the present invention.

FIG. 10 shows the implementation of an array using the dual cell architecture shown in FIG. 9.

FIGS. 8 and 10 show only the array implementation of the proposed cell using column mux=1. Those skilled in the art will appreciate that the proposed cell array can be implemented in any mux option like mux=2, mux=4, mus=8 etc.

The advantage of the proposed cell enhancement described above is to enable programming an entire NVM array or sector at the same time. The total programming time for the proposed invention is equivalent to the SRAM array write timing plus a single NVM cell program time. The SRAM write cycle time is usually small, in the nanosecond range. The prior art requires a total program time of N*M tprog. In addition, data read from the NVM array can be written back into the SRAM array by using external circuitry. The SRAM cell provides the capability to access data more quickly.

It should be understood that the particular embodiments of the invention described above have been provided by way of example and that other modifications may occur to those skilled in the art without departing from the scope and spirit of the invention as expressed in the appended claims and their equivalents.

What is claimed is:

1. A non-volatile memory (NVM) cell structure comprising:
   a first P-IGFET program transistor having a gate electrode connected to a common storage node;
   a second P-IGFET read transistor having a gate electrode connected to the common storage node;
   a third P-IGFET erase transistor having a gate electrode connected to the common storage node;
   a fourth P-IGFET control transistor having a gate electrode connected to the common storage node;
   a plurality of cascoded NMOS transistors connected between the P-IGFET program transistor and a negative supply voltage; and
   an SRAM cell structure connected to the gate electrode of one of the cascoded NMOS transistors.

2. A NVM cell structure as in claim 1, and wherein the cascoded NMOS transistors comprise:
   a first NMOS transistor connected to the P-IGFET program transistor, and having a gate electrode connected to a positive power supply;
   a second NMOS transistor connected to the first NMOS transistor, and having a gate electrode connected to a program word line of an associate NMV cell array; and
   a third NMOS transistor connected between the second NMOS transistor and the negative supply voltage.

3. A NVM cell structure as in claim 1, and wherein the SRAM cell structure comprises:
   a 4-transistor cross-coupled latch structure;
   a first NMOS pass gate transistor connected between the latch structure and a first bit line of an associated NVM cell array; and
   a second NMOS pass gate transistor connected between the latch structure and a second bit line of the associated NVM cell array.

4. A NVM cell structure as in claim 3, and wherein the first and second NMOS pass gate transistors each include a gate electrode that is connected to a word line of the associated NVM cell array.

5. A NVM cell structure as in claim 4, and further comprising:
   a fifth P-IGFET transistor having a source region connected to the P-IGFET read transistor, a drain region connected to a read bit line of the associated NVM cell array, and a gate electrode connected to a read word line of the associated NVM cell array.

6. A method of programming a NVM cell structure that includes a first P-IGFET program transistor having a source region, a bulk region, a drain region and a gate electrode connected to a common storage node, a second P-IGFET read transistor having interconnected source and bulk regions, a drain region and a gate electrode connected to the common storage node, a third P-IGFET erase transistor having interconnected drain, source and bulk regions and a gate electrode connected to the common storage node, a fourth P-IGFET control transistor having interconnected drain, source and bulk regions and a gate electrode connected to the common storage node, a plurality of cascoded NMOS transistors connected between the P-IGFET program transistor and a negative supply voltage, and an SRAM storage cell connected to the gate electrode of one of the cascoded NMOS transistors, the programming method comprising:
   prewriting data to the SRAM storage cell;
   grounding the source region and the drain region of each of the first, second, third and fourth P-IGFET transistors while allowing the gate electrode of said first, second, third and fourth P-IGFET transistors to float;
   applying an inhibiting voltage ($V_N$) to the interconnected drain, source and bulk regions of the P-IGFET erase transistor and to the drain region (Vr) of the P-IGFET read transistor, while applying a programming voltage to the drain region (Vp) of the P-IGFET program transistor to create a high lateral electric field between the source and the drain regions of the P-IGFET program transistor;
   sweeping the interconnected drain, source and bulk regions of the P-IGFET control transistor from 0V to a predefined maximum programming voltage in a preselected programming time; and
   at the end of the preselected programming time, ramping the interconnected drain, source and bulk regions of the P-IGFET control transistor from the predefined maximum programming voltage to 0V and returning all electrodes having the inhibiting voltage applied thereto to ground.

7. A method of programming a non-volatile memory (NVM) cell array that includes a plurality of NVM cells, each NVM cell in the array including a first P-IGFET program transistor having a source region, a bulk region, a drain region and a gate electrode connected to a common storage node, a second P-IGFET read transistor having interconnected source and bulk regions, a drain region and a gate electrode connected to the common storage node, a third P-IGFET erase transistor having interconnected drain, source and bulk regions and a gate electrode connected to the common storage node, a fourth P-IGFET control transistor having interconnected drain, source and bulk regions and a gate electrode connected to the common storage node, a plurality of cascoded NMOS transistors connected between the P-IGFET program transistor and a negative supply voltage; and an SRAM storage cell connected to the gate electrode of one of the cascoded and NMOS transistors, the programming method comprising:
   prewriting data to the SRAM storage cells of all NVM cells in the NVM cell array selected for programming;
   grounding the source region and the drain region of each of the first, second, third and fourth P-IGFET transistors in the NVM cell array while allowing the gate electrode of said first, second, third and fourth P-IGFET transistors to float;
   for all NVM cells in the NVM cell array selected for programming, applying an inhibiting voltage ($V_N$) to the interconnected drain, source and bulk regions of the P-IGFET erase transistor and to the drain region (Vr) of the P-IGFET read transistor, while applying a programming voltage the drain region (Vp) of the P-IGFET program transistor to create a high lateral electric field between the source and drain regions of the P-IGFET program transistor;
   for all NVM cells in the NVM cell array not selected for programming, applying the inhibiting voltage to the source, bulk and drain regions of the P-IGFET read transistor, to the source bulk and drain regions of the P-IGFET erase transistor and to the source, bulk and drain regions of the P-IGFET program transistor;

sweeping the interconnected drain, source and bulk regions of the P-IGFET control transistors in the NVM cell array from 0V to a predefined maximum programming voltage in a preselected programming time; and at the end of the preselected programming time, ramping the interconnected drain, source and bulk regions of the P-IGFET control transistors in the NVM cell array from the predefined maximum programming voltage to 0V and returning all electrodes having the inhibiting voltage applied thereto to ground.

8. A dual non-volatile memory (NVM) cell structure comprising:

(a) first and second P-IGFET NVM structures, each of said first and second P-IGFET NVM structures including:

a first P-IGFET program transistor having a gate electrode connected to a common storage node;

a second P-IGFET read transistor having a gate electrode connected to the common storage node;

a third P-IGFET erase transistor having a gate electrode connected to the common storage node;

a fourth P-IGFET control transistor having a gate electrode connected the common storage node; and a plurality of cascoded NMOS transistors connected between the P-IGFET program transistor and a negative supply voltage; and (b) an SRAM cell structure having first and second data storage nodes, the first data storage node connected to the gate electrode of one of the cascoded NMOS transistors of the first P-IGFET NVM structure and the second data storage node connected to the gate electrode of one of the cacscoded NMOS transistors of the second P-IGFET NVM structure.

9. A dual NVM cell structure as in claim 8, and wherein the cascoded NMOS transistors in each if the first and second P-IGFET NVM structures comprise:

a first NMOS transistor connected to the P-IGFET program transistor, and having a gate electrode connected to a positive power supply;

a second NMOS transistor connected to the first NMOS transistor, and having a gate electrode connected to a program word line of an associated NVM cell array; and a third NMOS transistor connected between the second NMOS transistor and the negative supply voltage.

10. A dual NVM cell structure as in claim 8, and wherein the SRAM cell structure comprises:

a 4-transitor cross-coupled latch structure;

a first NMOS pass gate transistor connected between the latch structure and a first bit line of an associated NVM cell array; and a second NMOS pass gate transistor connected between the latch structure and a second bit line of the associated NVM cell array.

11. A dual NVM cell structure as in claim 10, and wherein the first and second NMOS pass gate transistors each include a gate electrode that is connected to a word line of the associated NVM cell array.

12. A dual NVM cell structure as in claim 11, and further comprising:

in each of the first and second P-IGFET NVM structures, a fifth P-IGFET transistor having a source region connected to the P-IGFET read transistor, a drain region connected to a read bit line of the associated NVM cell array, and a gate electrode connected to a read word line of the associated NVM cell array.

13. A method of programming a dual NVM cell structure that includes (i) first and second P-IGFET NVM structures, each of said first and second P-IGFET NVM structures including a first P-IGFET program transistor having a gate electrode connected to a common storage node, a second P-IGFET read transistor having a gate electrode connected to a common storage node, a third P-IGFET erase transistor having a gate electrode connected to the common storage node, a fourth P-IGFET control transistor connected to the common storage node and a plurality cascoded NMOS transistors connected between the P-IGFET program transistor and a negative supply voltage and (ii) an SRAM cell structure having first and second data storage nodes, the first data storage node connected to a gate electrode of one of the cascoded NMOS transistors of the first P-IGFET NVM structure and the second data storage node connected to the gate electrode of one of the cascoded NMOS transistors of the second P-IGFET NVM structure, the programming method comprising:

(a) prewriting data to the SRAM storage cell;

(b) for each of the first and second P-IGFET NVM structures, grounding the source region and the drain region of each of the first, second, third and fourth P-IGFET transistors while allowing the gate electrode of said first, second, third and fourth P-IGFET transistors to float;

applying an inhibiting voltage ($V_N$) to the interconnected drain, source and bulk regions of the P-IGFET erase transistor and to the drain region (Vr) of the P-IGFET read transistor, while applying a programming voltage to the drain region (Vp) of the P-IGFET program transistor to create a high lateral electric field between the source and drain regions of the P-IGFET program transistor;

sweeping the interconnected drain, source and bulk regions of the P-IGFET control transistor from 0V to a predefined maximum programming voltage for a preselected programming time; and at the end of the preselected programming time, ramping the interconnected drain, source and bulk regions of the P-IGFET control transistor from the predefined maximum programming voltage to 0V and returning all electrodes having the inhibiting voltage applied thereto to ground.

14. A method of programming a non-volatile memory (NVM) cell array that includes a plurality of dual NVM cell structures, each dual NVM cell structure in the array including (i) first and second P-IGFET NVM structures, each of the first and second P-IGFET NVM structures including a first P-IGFET program transistor having a gate electrode connected to a common storage node, a second P-IGFET read transistor having a gate electrode connected to the common storage node, a third P-IGFET erase transistor having a gate electrode connected to the common storage node, a fourth P-IGFET control transistor having a gate electrode connected to the common storage node and a plurality of cascoded NMOS transistors connected between the P-IGFET program transistor and a negative supply voltage and (ii) an SRAM cell structure having first and second data storage nodes, the first data storage node connected to the gate electrode of one of the cascoded NMOS transistors of the first P-IGFET NVM structure and the second data storage node connected to the gate electrode of one of the cascoded NMOS transistors of the second P-IGFET NVM structure, the programming method comprising:
(a) prewriting data to the SRAM storage cells of all NVM cells in the nVM cell array selected for programming;
(b) for each of the first and second P-IGFET NVM structures of all NVM cells of the NVM cell array,
grounding the source region and the drain region of each of the first, second, third and fourth p-IGFET transistors while allowing the gate electrode of said first, second, third and fourth P-IGFET transistors to float;
applying an inhibiting voltage ($V_N$) to the interconnected drain, source and bulk regions of the P-IGFET erase transistor and to the drain region (Vr) of the P-IGFET read transistor, while applying a programming voltage to the drain region (Vp) of the P-IGFET program transistor to create a high lateral electric field between the source and drain regions of the P-IGFET program transistor;
sweeping the interconnected drain, source and bulk regions of the P-IGFET control transistor from 0V to a predefined maximum programming voltage for a preselected programming time; and
at the end of the preselected programming time, ramping the interconnected drain, source and bulk regions of the P-IGFET control transistor from the predefined maximum programming voltage to 0V and returning all electrodes having the inhibiting voltage applied thereto to ground.

* * * * *